United States Patent
Lin et al.

(10) Patent No.: US 6,617,081 B2
(45) Date of Patent: Sep. 9, 2003

(54) METHOD FOR IMPROVING PROCESS WINDOW IN SEMI-DENSE AREA BY USING PHASE SHIFTER

(75) Inventors: Chih-Yung Lin, Hsin-Chu (TW); Chien-Wen Lai, Taipei (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/813,048

(22) Filed: Mar. 20, 2001

(65) Prior Publication Data

US 2002/0136962 A1 Sep. 26, 2002

(51) Int. Cl.⁷ ................................................ G03F 9/00
(52) U.S. Cl. ............................................................ 430/5
(58) Field of Search ............................ 430/5, 322, 323, 430/324, 311, 312, 313

(56) References Cited

U.S. PATENT DOCUMENTS

| | | | | | |
|---|---|---|---|---|---|
| 5,376,483 | A | * | 12/1994 | Rolfson | 430/5 |
| 5,702,848 | A | * | 12/1997 | Spence | 430/5 |
| 5,882,827 | A | * | 3/1999 | Nakao | 430/5 |
| 6,410,191 | B1 | * | 6/2002 | Nistler et al. | 430/5 |

* cited by examiner

Primary Examiner—S. Rosasco
(74) Attorney, Agent, or Firm—Dickinson Wright PLLC

(57) ABSTRACT

In accordance with the present invention, a method is provided for improving process window in semi-dense area by using a phase shifter. This method comprises a step of providing a transparent substrate. Then, at least two opaque regions are formed on the substrate. A phase shifter is formed in the substrate, wherein the phase shifter is formed in-between adjacent opaque regions. As a result, the phase shifter shifts the incident beam at an angle that reduces the proximity effect and improves the optical contrast and the depth of focus (DOF) to get wider process window.

17 Claims, 6 Drawing Sheets

METHOD FOR IMPROVING PROCESS WINDOW IN SEMI-DENSE AREA BY USING PHASE SHIFTER

BACKGROUND OF THE INVENTION

1. Field of the Invention

The present invention generally relates to a method for improving process window in semiconductor processes, and more particularly to a method for improving process window in semi-dense area by using phase shifter.

2. Description of the Prior Art

The need to maintain cost and performance competitiveness in the manufacture of semiconductor devices gives rise to integrated circuits with increasing density. As high integration is greatly required in manufacturing integrated circuits, the miniaturization of the circuit pattern formed on a semiconductor wafer, therefore, is consequently developed. Optical lithography is one of the techniques commonly employed to transform the miniaturized circuit pattern to define on the wafer.

Design rules define the space tolerance between devices or interconnect lines so as to ensure that the devices or lines do not interact with one another in any unwanted manner. One important layout design rule which tends to determine the overall size and density of the semiconductor device is the critical dimension (CD). A critical dimension of a circuit is commonly defined as the smallest width of a line or the smallest space between two lines. Another critical design rule defines the minimum of the width of a given feature plus the distance to the adjacent feature edge as the minimum pitch.

Once the layout of the circuit is created, the photolithographic process utilizes an exposure tool to irradiate a layer of photoresist on the wafer through a mask to transfer the pattern on the mask to the wafer. As the critical dimensions of the layout approach the resolution limit of the lithography equipment, proximity effects begin to influence the manner in which features on a mask transfer to the resist layer such that the masked and actual layout patterns begin to differ. Proximity effects are known to result from optical diffraction in the projection system. The diffraction causes adjacent features to interact with one another in such a way as to produce pattern-dependent variations; the closer together features are, the more proximity effect is seen.

One specific proximity effect related problem occurs when features are designed to have the same dimension, but are placed in a different proximity to other features in a layout. Features have edges in close proximity to other features (referred to as in dense area) that are more affected by proximity effects while features have edges that are relatively isolated are less affected by proximity effects. As a result, a feature in dense area tends to be printed differently than an isolated feature. For the manufacture of the semiconductor device in order to improve resolution and process window, the resolution enhanced technology (RET) has been applied, such as optical proximity correction (OPC), off axis illumination (OAI), and phase shift mask (PSM). Optical proximity correction is the process of selecting biasing of mask patterns to compensate for the pattern distortions occurring during wafer processing. By use of off off axis illumination technique, it is possible to separate the exposure in different directions.

A phase shift mask is essentially composed broadly of a light screen pattern and a phase shift pattern. The phase shift pattern plays the role of shifting an incident beam at a specific angle. Such a phase shift mask is designed to keep the amplitude of the light illuminated on the wafer constant at the exposing step and to minimize the proximity effect caused by interference between a beam passing through one line of the phase shift pattern and another beam passing through another line adjacent to the one line. Thereby, the resolution of the photosensitive film pattern is improved.

Scattering bars (also referred to as intensity leveling bars and assist features) have also been developed in order to minimize or eliminate proximity effects between "isolated" and "densely packed" edges of features in a lithographic process. Scattering bars are correction features (typically non-resolvable) that are placed next to isolated edges on a mask in order to adjust the edge intensity at the isolated edge to match the edge intensity at a densely packed edge. Thereby, by use of scattering bars causes the feature having at least one isolated edge to have nearly the same width as features having densely packed edges.

However, it does not take into consideration that inserting assist features into the spacing between features edges in semi-dense area is not feasible by use of state-of-the-art technology of manufacturing the photomask. Scattering bars are "subresolution" reticle features because the corresponding image, when projected onto the resist layer, is below the resolution limit and does not substantially pattern the underlying resist layer. For the photolithographic technique known in the art, by use of scattering bars means to insert assist features whose widths are less than 0.07 $\mu$m into the spacing between features edges in a semi-dense area of deep submicron. A process window, such as the depth of focus, exposure latitude, and the exposure energy window, plays a critical role in a photolithographic process. That is to say, by application of assist features, incorporated with off-axis illumination in order to increase the process window of deep submicron, encounters another problem that it is difficult to insert assist features into the semi-dense area when a photomask is manufactured, so that it's hardly improve the process window in semi-dense area. What is needed is a more feasible method to increase the process window in a semi-dense area.

SUMMARY OF THE INVENTION

The present invention is directed to a method that satisfies this need to increase the process window in the semi-dense area during the manufacture of semiconductor devices. The method is provided for improving process window in semi-dense area by using a phase shifter. This method comprises a step of providing a transparent substrate. Then, at least two opaque regions are formed on the substrate. A phase shifter with a depth is formed in the substrate, wherein the phase shifter is formed in-between adjacent opaque regions. Thus, a phase shift mask with a light screen pattern is formed, which is designed to shift the phase of light in accordance with the thickness of the substrate by removing to a predetermined depth of the substrate corresponding to the space between opaque regions. As a result, the phase shifter shifts the incident beam at an angle that reduces the proximity effect and improves the optical contrast and the depth of focus (DOF) to get wider process window.

It is another object of this invention that a method for generating a phase shift mask to reduce the proximity effect is provided.

It is a further object of this invention that a method for improving the optical contrast in semi-dense area is provided.

It is another further object of this invention that a method for improving the depth of focus in semi-dense area is provided.

In one embodiment, a method for improving process window in semi-dense area by using a phase shifter is disclosed. The method comprises a step of providing a transparent substrate, which can be a quartz substrate. Then, at least two opaque regions are formed on the substrate, wherein each opaque region is a feature with a certain width of a photomask, and there is a distance between two adjacent features, which is defined as a space. Duty ratio is defined as the ratio of a space to a feature width. The step of forming the opaque regions comprises a step of forming an opaque layer on the substrate. Then, a patterned photoresist is formed on the opaque layer, wherein the patterned photoresist defines the opaque regions on the opaque layer. Then, the opaque layer is etched to form the opaque regions on the substrate by using the patterned photoresist as a mask. A phase shifter with a depth is formed in the substrate, wherein the phase shift is formed in between adjacent opaque regions. The step of forming the phase shifter comprises a step of forming a patterned resist mask on the substrate, wherein the patterned resist mask defines the phase shifter on the substrate. Then, a portion of the substrate is etched to form the phase shifter with a depth in the substrate using the resist mask, wherein the phase shifter is formed in-between the adjacent opaque regions. The etching depth of the substrate is depended on the angle needed to shift the incident beam that reduce the proximity effect. As a result, the phase shifter shifts the incident beam at an angle, such as about 60 degree, that decreases the proximity effect and improves the optical contrast and the depth of focus (DOF) to get wider process window.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1A:
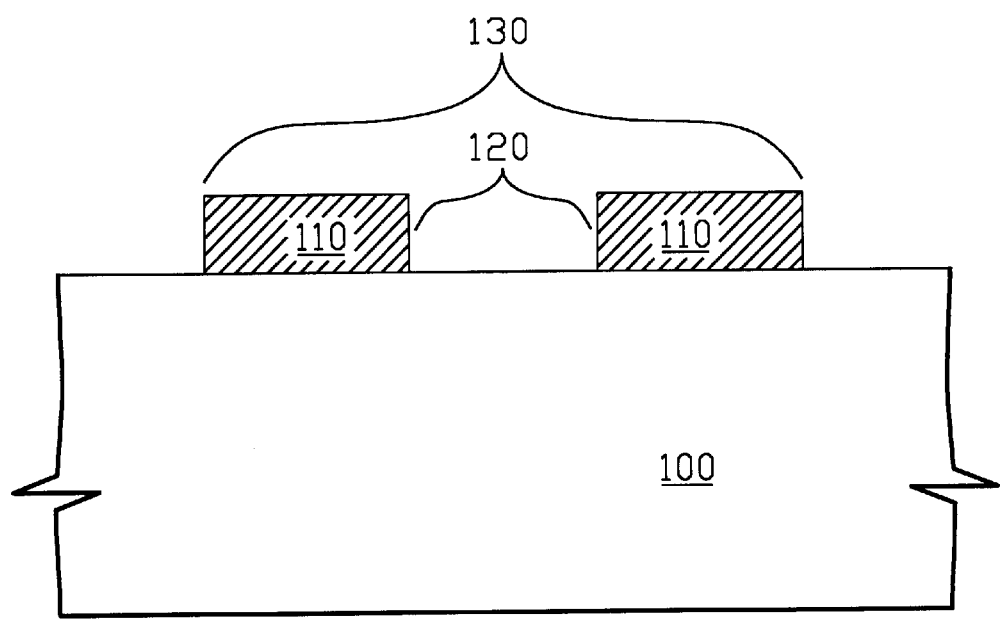
FIG. 1A is a schematic representation of opaque regions formed on the substrate.

In a preferred embodiment, a method for improving process window in semi-dense area by using a phase shifter is provided. The method comprises a step of providing a transparent substrate 100, which can be a quartz substrate. Then, at least two opaque regions 110 are formed on the quartz substrate 100, wherein each opaque region 110 is a feature with a certain width of a photomask, and there is a distance between two adjacent features, which is defined as a space 120. The space 120, which has a distance from a feature to the next adjacent feature, is a light transmissive region. Features of the photomask can be line patterns, so a photomask with a light screen pattern 130 is formed, shown in FIG. 1. Thus, a duty ratio is the ratio of a space to a line width. The dense area is defined as a region with a duty ratio about 1:1. The isolated area has a duty ratio greater than approximately 5:1. The semi-dense area is a region with a duty ratio between those in a dense and an isolated area, such as 1:1 to 5:1. The step of forming the opaque regions 110 comprises a step of forming an opaque layer on the quartz substrate 100, wherein the opaque layer can be a chromium layer. Then, a patterned photoresist is formed on the chromium layer, wherein the patterned photoresist defines the opaque regions 110 on the chromium layer. Then, the chromium layer is etched to form the opaque regions 110 on the quartz substrate 100 by using the patterned photoresist as a mask.

Figure 1B:
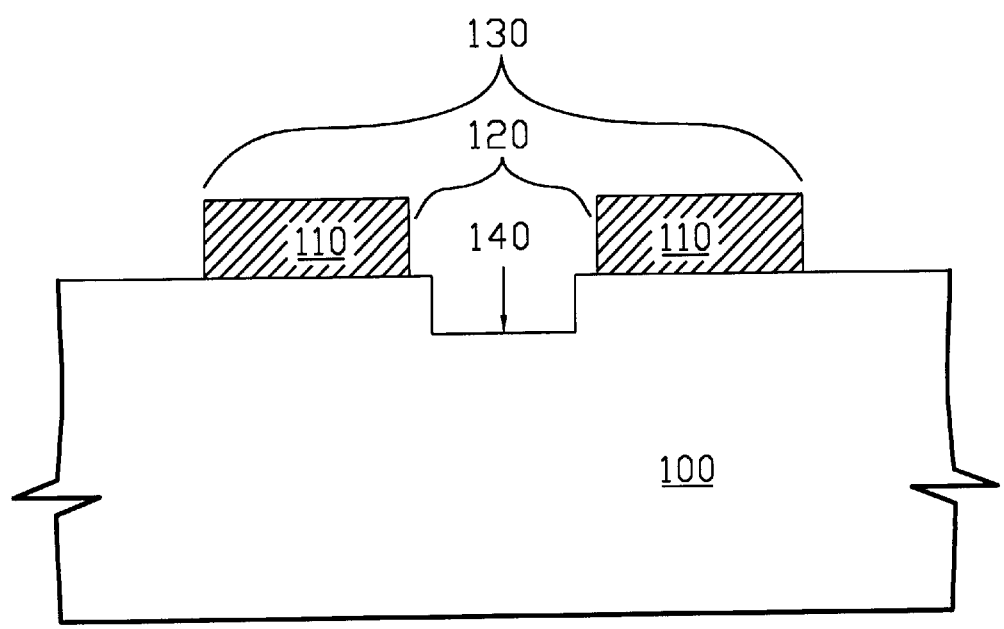
FIG. 1B is a schematic representation of the substrate with the phase shifter formed.
Figure 2:
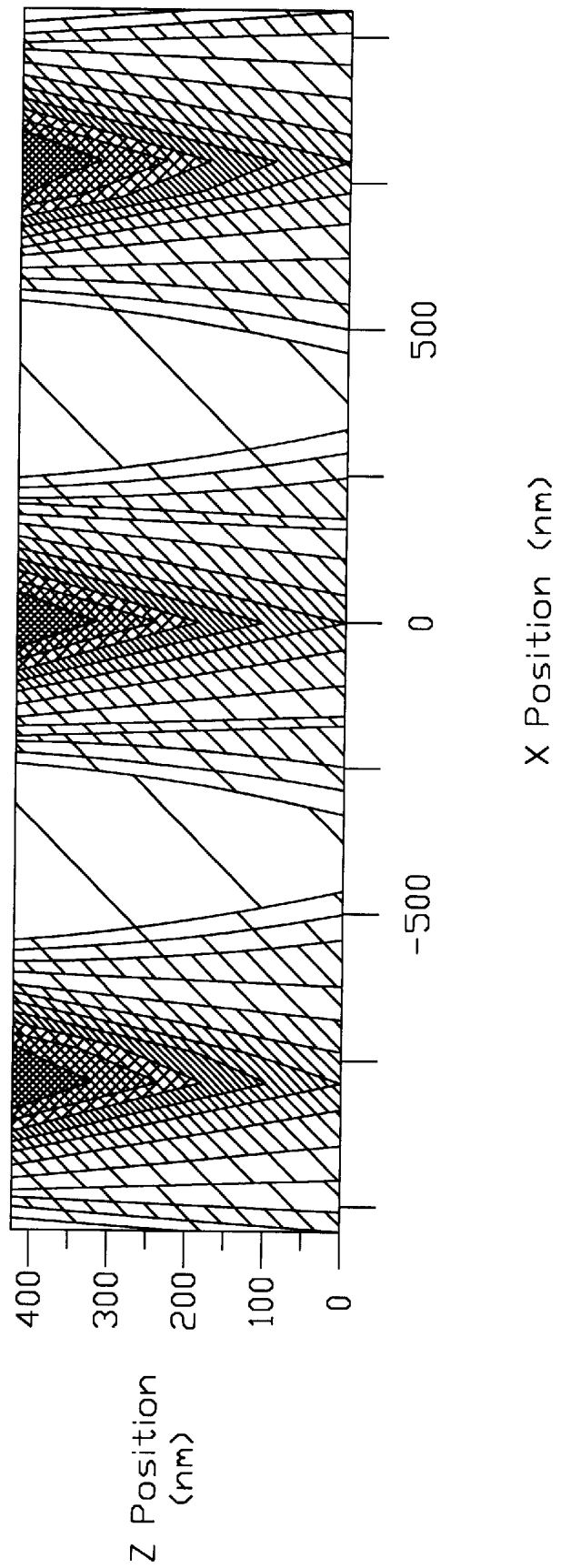
FIG. 2 is a schematic representation of optical contrast in aerial image of a conventional prior art technique.

A phase shifter 140 with a depth is formed in the quartz substrate 100, wherein the phase shifter 140 is formed in-between adjacent opaque regions 110, shown in FIG. 1B. That is to say, a new design mask pattern, which inserts a phase shift angle area in-between the semi-dense lines, is accomplished. The depth of the phase shifter is depended on the angle needed to shift the incident beam. According to the results from using the Prolith simulation tool, the optical contrast in aerial image of a conventional prior art technique and that of the present invention at different phase shift angles, such as at angles of 30°, 60°, and 90°, are shown in FIG. 2 and FIGS. 3A to 3C, respectively. Comparing the optical contrast in aerial image of a traditional pattern and that of the present invention, it is clear that the optical contrast is improved by using the present invention.

Figure 3A:
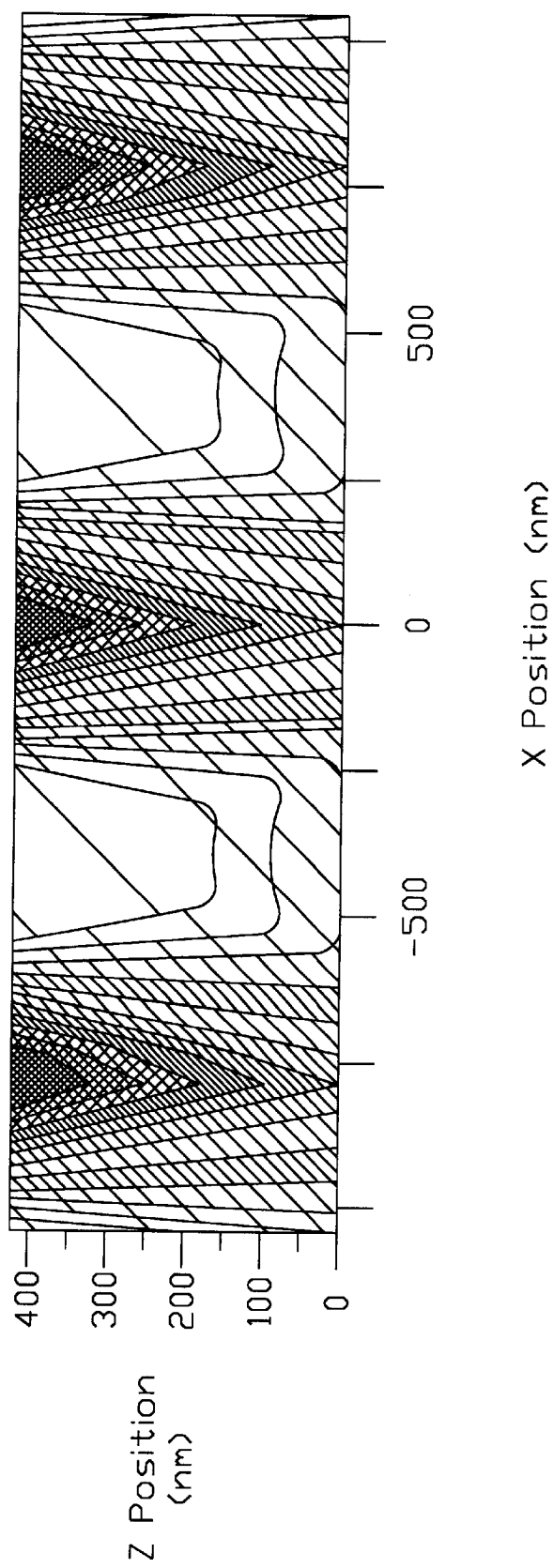
FIGS. 3A to 3C are schematic representations of optical contrast in aerial image at different phase shift angles, 60°, 30°, and 90° by use of the present invention.
Figure 3B:
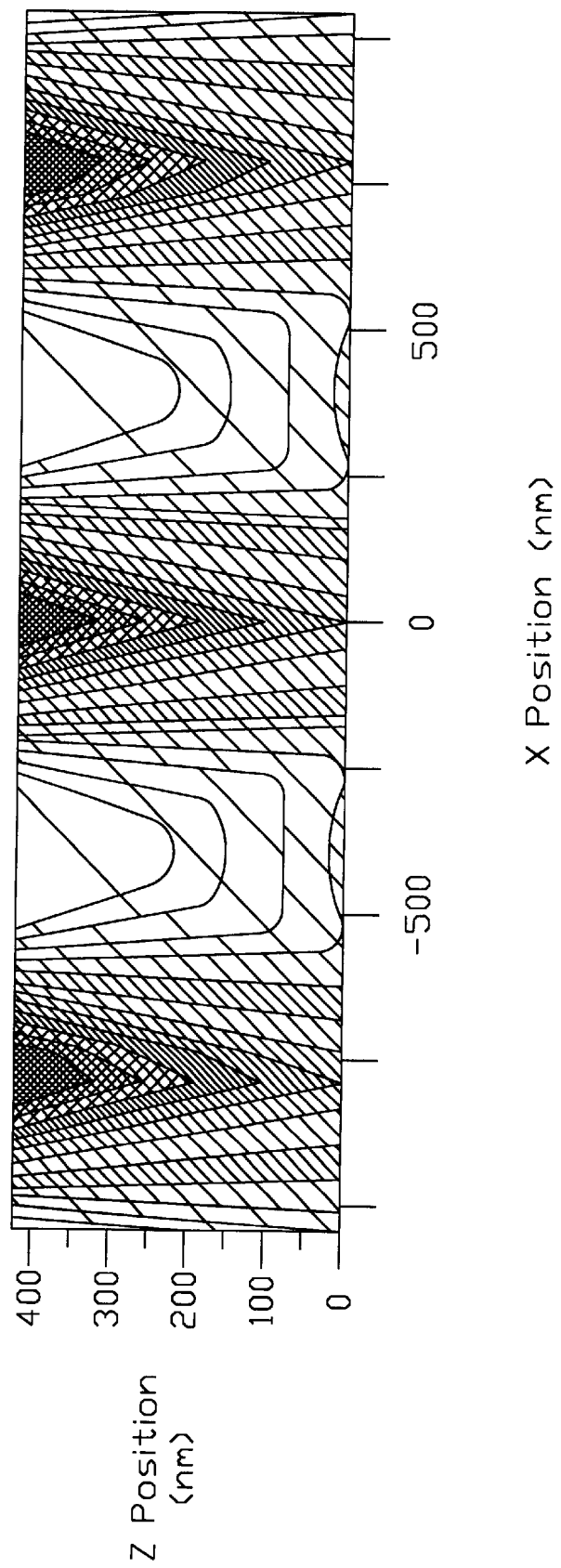
Figure 3C:
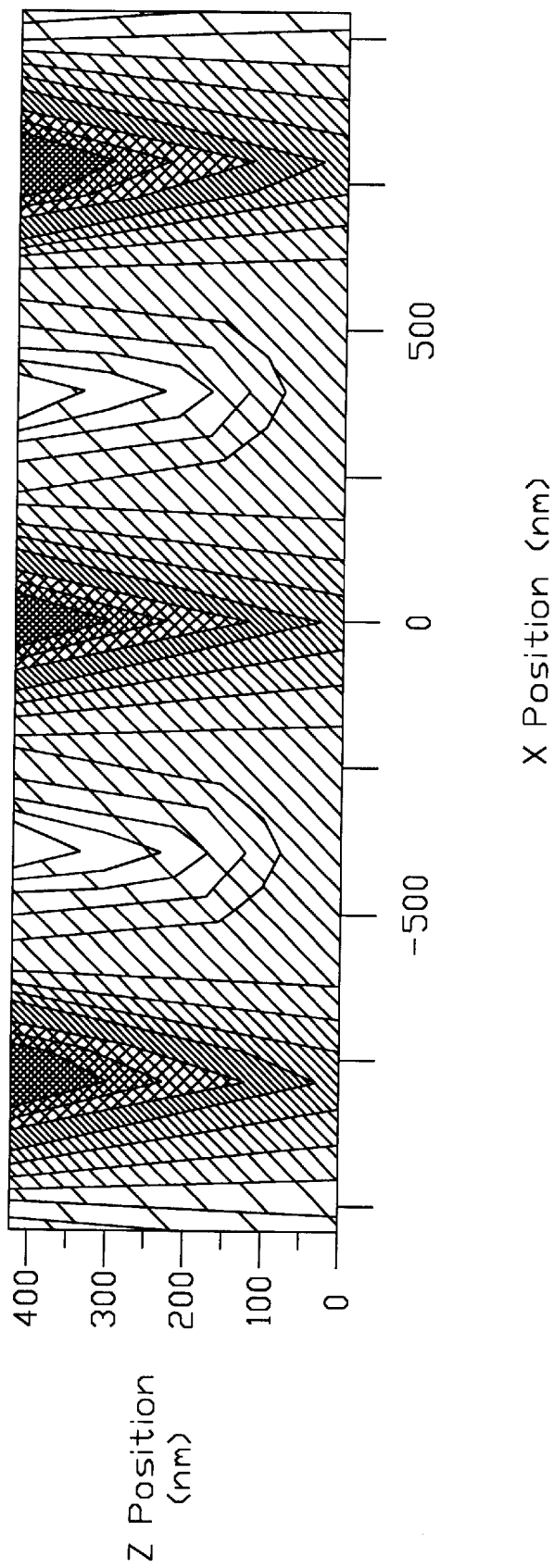

Comparing the optical contrast in aerial images of the present invention at different phase shift angles shows that the optical contrast in aerial image at the phase shift angle of 30° has not improved the process window much, shown in FIG. 3A. The optical contrast in aerial image at the angle 90° shows that the optical contrast is worse in the space area, shown in FIG. 3C. Referring to FIG. 3B, the optical contrast in aerial image of 60° shows that the optical contrast is greatly improved at the phase shift angle of 60°. That is to say, the preferred phase shift angle of the present invention is about 60° and the depth of forming the phase shift pattern is predetermined by the preferred phase shift angle.

The step of forming the phase shifter 140 comprises a step of forming a patterned resist mask on the substrate 100, wherein the patterned resist mask defines the phase shifter 140 on the substrate 100. Then, a portion of the substrate 100 is etched to form the phase shifter 140 with a depth in the substrate 100 using the resist mask, wherein the phase shifter 140 is formed in-between the adjacent opaque regions 110. The etching depth of the substrate 100 is depended on the angle needed to shift the incident beam that reduce the proximity effect. In other words, for a semi-dense area with a duty ratio of about 3:1, the line width is about 0.14 micrometer ($\mu$m) and the distance of space is about 0.46 $\mu$m. By use of the present invention, a phase shift angle of 60 degree with a width about 0.26 $\mu$m is inserted in the space, and the edge to each side is about 0.1 $\mu$m. For manufacturing the photomask, it is a significant advantage that creating a 0.26 $\mu$m phase shift pattern is much easier and more practical than inserting a small assist feature with a line width less than 0.07 $\mu$m.

Figure 4:
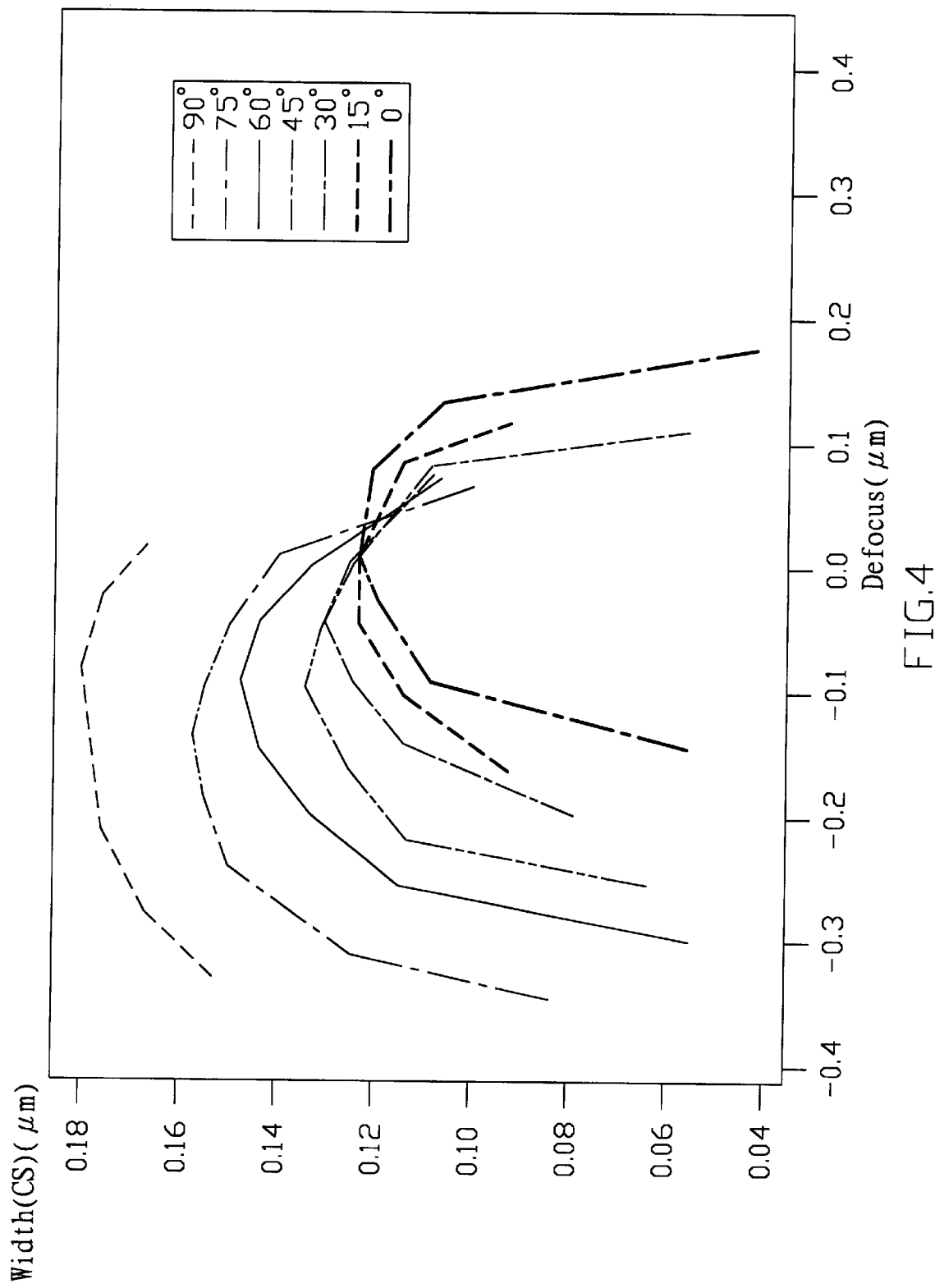
FIG. 4 is a schematic representation of the depth of focus comparing with the prior art and the present invention.

Referring to FIG. 4, a schematic illustration of a result from the C simulation tool is shown. Comparing to the conventional technique, an improvement of two times of the depth of focus is presented by the present invention. It shows that for a phase shift angle of 60°, the depth of focus is two times of that comparing to the prior art. As a result, the phase shifter 140 shifts the incident beam at an angle that reduces the proximity effect and improves the optical contrast and the depth of focus to get wider process window in the semi-dense area wherein is difficult for the application of assist features.

Although specific embodiments have been illustrated and described, it will be obvious to those skilled in the art that various modifications may be made without departing from what is intended to be limited solely by the appended claims.

What is claimed is:

1. A method for making a phase shift mask, said method comprising:

providing a transparent substrate;

forming at least two opaque regions on said transparent substrate; and forming a phase shifter with a depth in said transparent substrate, wherein said phase shifter is located between adjacent said opaque regions, and said depth of said phase shifter shifts an incident light about 60 degrees.

2. The method according to claim 1, wherein said substrate is a quartz substrate.

3. The method according to claim 1, wherein said step of forming at least two said opaque regions on said transparent substrate comprises:

forming an opaque layer on said transparent substrate;

forming a patterned photoresist on said opaque layer, wherein said patterned photoresist defines said opaque regions on said opaque layer; and etching said opaque layer to form said opaque regions on said transparent substrate by using said patterned photoresist as a mask.

4. The method according to claim 3, wherein said opaque layer can be a chromium film.

5. The method according to claim 1, wherein said opaque region is a line pattern.

6. The method according to claim 1, wherein said opaque regions with a duty ratio is about less than 5:1.

7. The method according to claim 1, wherein said step of forming said phase shifter with said depth in said transparent substrate comprises:

forming a patterned resist mask on said transparent substrate, wherein said patterned resist mask defines said phase shifter on said transparent substrate; and etching a portion of said substrate to form said phase shifter with said depth in said transparent substrate using said resist mask, wherein said phase shifter is located between adjacent said opaque regions.

8. A method for making a phase shift mask, said method comprising:

providing a quartz substrate;

forming at least two chromium regions each having a line pattern on said quartz substrate; and forming a phase shifter with a depth in said quartz substrate, wherein said phase shifter is located between adjacent said chromium regions, and said depth of said phase shifter shifts an incident light about 60 degrees.

9. The method according to claim 8, wherein said step of forming at least two said chromium regions on said quartz substrate comprises:

forming a chromium layer on said quartz substrate;

forming a patterned photoresist on said chromium layer, wherein said patterned photoresist defines said line patterns on said chromium layer; and etching said chromium layer to form said chromium regions on said quartz substrate by using said patterned photoresist as a mask.

10. The method according to claim 8, wherein said chromium regions with a duty ratio is about less than 5:1.

11. The method according to claim 8, wherein said step of forming said phase shifter with said depth in said quartz substrate comprises:

forming a patterned resist mask on said quartz substrate, wherein said patterned resist mask defines said phase shifter on said quartz substrate; and etching a portion of said quartz substrate to form said phase shifter with said depth in said quartz substrate using said resist mask, wherein said phase shifter is formed in-between adjacent said chromium regions.

12. A method for making a phase shift mask, said method comprising:

providing a quartz substrate;

forming at least two chromium regions each having line pattern on said quartz substrate;

forming a patterned resist mask on said quartz substrate, wherein said patterned resist mask defines a phase shifter with a depth on said quartz substrate, and said depth of said phase shifter shifts an incident light about 60 degrees and etching a portion of said quartz substrate to form said phase shifter with said depth in said quartz substrate using said resist mask, wherein said phase shifter is formed in-between adjacent said chromium regions.

13. The method according to claim 12, wherein said step of forming at least two said chromium regions on said quartz substrate comprises:

forming a chromium layer on said quartz substrate;

forming a patterned photoresist on said chromium layer, wherein said patterned photoresist defines said line patterns on said chromium layer; and etching said chromium layer to form said chromium regions on said quartz substrate by using said patterned photoresist as a mask.

14. The method according to claim 12, wherein said chromium regions with a duty ratio is about less than 5:1.

15. A method for making a phase shift mask, said method comprising:

providing a quartz substrate;

forming at least two chromium regions each having a line pattern on said quartz substrate;

forming a patterned resist mask on said quartz substrate, wherein said patterned resist mask defines a phase shifter with a depth on said quartz substrate, and said depth of said phase shifter shifts an incident light about 60 degrees; and etching a portion of said quartz substrate to form said phase shifter with said depth in said quartz substrate using said resist mask, wherein said phase shifter is formed in-between adjacent said chromium regions, and the edge to each side is about 0.1 um.

16. The method according to claim 15, wherein said step of forming at least two said chromium regions on said quartz substrate comprises:

forming a chromium layer on said quartz substrate;

forming a patterned photoresist on said chromium layer, wherein said patterned photoresist defines said line patterns on said chromium layer; and etching said chromium layer to form said chromium regions on said quartz substrate by using raid patterned photoresist as a mask.

17. The method according to claim 15, wherein said chromium regions with a duty ratio is about less than 5:1.

* * * * *